United States Patent
Young (10) Patent No.: US 6,661,330 B1
(45) Date of Patent: Dec. 9, 2003

(54) ELECTRICAL FUSE FOR SEMICONDUCTOR INTEGRATED CIRCUITS

(75) Inventor: Bradley Scott Young, Irving, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/201,380

(22) Filed: Jul. 23, 2002

(51) Int. Cl.[7] .................... H01H 85/046; H01H 85/02; H01L 21/324
(52) U.S. Cl. .................... 337/297; 337/296; 337/290; 365/225.7; 257/529; 438/467
(58) Field of Search .................... 337/290, 295, 337/296, 297, 227, 231, 159; 438/467, 600, 601; 257/209, 529, 530; 365/225.7

(56) References Cited

U.S. PATENT DOCUMENTS

| | | | | |
|---|---|---|---|---|
| 4,494,135 A | * | 1/1985 | Moussie | 257/50 |
| 4,814,853 A | * | 3/1989 | Uchida | 257/530 |
| 5,264,725 A | * | 11/1993 | Mullarkey et al. | 257/665 |
| 5,436,496 A | * | 7/1995 | Jerome et al. | 257/529 |
| 5,708,291 A | * | 1/1998 | Bohr et al. | 257/529 |
| 5,854,510 A | * | 12/1998 | Sur, Jr. et al. | 257/529 |
| 5,903,041 A | * | 5/1999 | La Fleur et al. | 257/530 |
| 5,963,825 A | | 10/1999 | Lee et al. | |
| 6,033,939 A | * | 3/2000 | Agarwala et al. | 438/132 |
| 6,088,256 A | * | 7/2000 | Worley et al. | 365/96 |
| 6,097,077 A | * | 8/2000 | Gordon et al. | 257/530 |
| 6,166,421 A | * | 12/2000 | Kalnitsky et al. | 257/529 |
| 6,242,790 B1 | * | 6/2001 | Tsui et al. | 257/529 |
| 6,323,534 B1 | * | 11/2001 | Marr et al. | 257/529 |
| 6,333,546 B1 | * | 12/2001 | Marmillion et al. | 257/529 |
| 6,368,902 B1 | | 4/2002 | Kothandaraman et al. | |
| 6,420,217 B1 | * | 7/2002 | Kalnitsky et al. | 438/132 |
| 6,496,416 B1 | * | 12/2002 | Look | 365/185.18 |

* cited by examiner

*Primary Examiner*—Anatoly Vortman
(74) *Attorney, Agent, or Firm*—Jacqueline J. Garner; W. James Brady, III; Frederick J. Telecky, Jr.

(57) ABSTRACT

The present invention relates to a fuse and a method for forming a fuse over a semiconductor substrate. The fuse comprises forming a first contact member and a second contact member over a respective first region and a second region of a patterned, electrically-conductive silicide layer, wherein the first contact member and the second contact member electrically contact the silicide layer, thereby defining a first interface and a second interface, respectively. A first contact area and a second contact area are associated with the respective first contact member and second contact member, wherein the first contact area is larger than the second contact area, thereby defining a fusible link at the second interface. According to one example, the silicide resides over a patterned polysilicon layer, wherein the patterned polysilicon layer generally tapered, and wherein the first region is wider than the second region.

24 Claims, 12 Drawing Sheets

ELECTRICAL FUSE FOR SEMICONDUCTOR INTEGRATED CIRCUITS

TECHNICAL FIELD OF INVENTION

The present invention relates generally to fuses, and, more particularly, uses formed over a semiconductor substrate having controlled and predictable areas of degradation.

BACKGROUND OF THE INVENTION

In the semiconductor industry, fuse elements are a widely used feature in integrated circuits for a variety of purposes, such as improving manufacturing yield or customizing a generic integrated circuit. For example, by replacing defective circuits on a chip with duplicate or redundant circuits on the same chip, manufacturing yields can be significantly increased. Typically, in order to replace a defective circuit or memory cell, conductive connections, or fuses, are cut or "blown", thereby allowing a redundant circuit to be used in place of the defective circuit. It is also common practice in the manufacture of integrated circuits to provide for customization of chips or modules to adapt chips to specific applications. By selectively blowing fuses within an integrated circuit which has multiple potential uses, a generic integrated circuit design may be economically manufactured and adapted to a variety of custom uses.

Typically, fuses or fusible links are incorporated in the design of the integrated circuit, wherein the fuses are selectively blown, for example, by passing an electrical current of a sufficient magnitude to cause the fusible link to change its structure, for example, by melting or otherwise become altered, thereby creating a more resistive path or an open circuit. Alternatively, a current that is weaker than the current required to entirely blow the fuse can be applied to the fuse in order to degrade the fuse, thus increasing a resistance through the fuse. The process of selectively blowing or degrading fuses is often referred to as "programming". An alternative to blowing fusible links with an electrical current is to open a window above each fuse to be blown, use a laser to blow each of the fuses, and then fill the windows with a passivation layer. Blowing the fuses with a laser, however, can potentially increase manufacturing costs, since additional components such as the laser and other associated equipment for alignment of the laser is generally required.

Figure 1A:
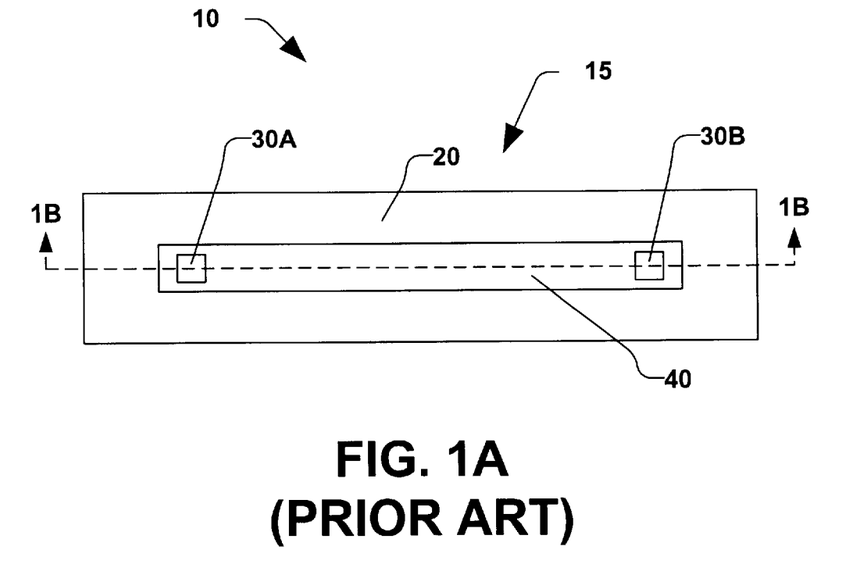
FIG. 1A illustrates a plan view of a conventional fuse.
Figure 1B:
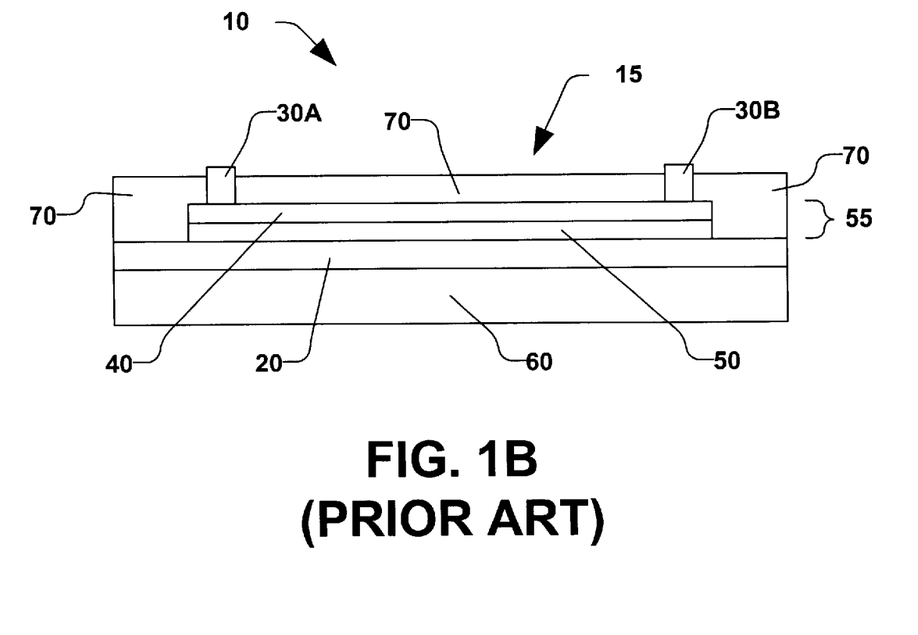
FIG. 1B illustrates a cross-section view of the conventional fuse illustrated in FIG. 1A.
Figure 1C:
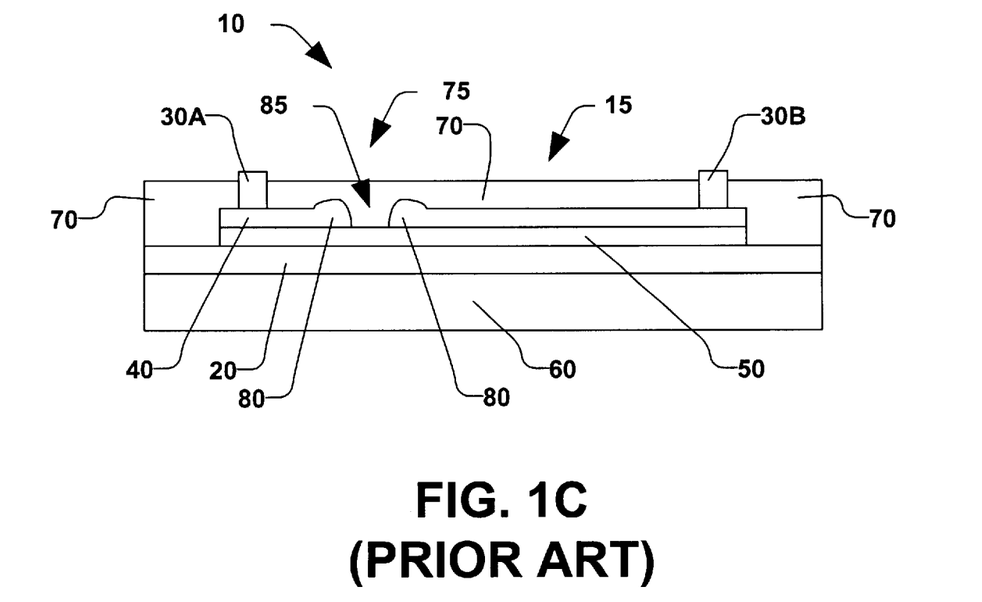
FIG. 1C illustrates the cross-section shown in FIG. 1B after the conventional fuse has been programmed.

One exemplary conventional fuse which can be blown using a programming current is illustrated in FIGS. 1A–1C. FIGS. 1A and 1B illustrate a top plan view and a cross-section, respectively, of a portion 10 of an integrated circuit (not shown) comprising a conventional fuse 15 prior to programming. FIG. 1A illustrates the fuse 15 which has been formed over an insulation layer 20, wherein the fuse comprises two contacts 30 which are in electrical contact with an electrically conducting silicide layer 40. As illustrated in cross-section in FIG. 1B, the silicide layer 40 is disposed over a polysilicon layer 50, wherein the silicide layer 40 and the polysilicon layer 50 are generally arranged in a stack 55 residing over the insulation layer 20. Typically, the insulation layer 20 is an oxide layer which has been deposited or grown on a semiconductor substrate 60, such as monocrystalline silicon. Furthermore, the fuse 15 is generally covered with an insulative passivation layer 70 to electrically isolate the fuse from other devices (not shown).

During programming and operation, electrical current flowing through the fuse 15 will generally proceed from one contact 30A, through the silicide layer 40, to the other contact 30B. If the current is increased to a level that exceeds a predetermined threshold current of the fuse 15, the silicide layer 40 will change its state, for example, by melting, thereby altering a resistance of the structure. Note that depending on the sensitivity of the sensing circuitry (e.g., a sense amp), a fuse may be considered "blown" if a change in resistance is only modest. Therefore the term "blowing" a fuse may be considered to broadly cover a modest alteration of the resistance or alternatively may comprise a complete open circuit. FIG. 1C illustrates the cross section of the fuse 15 shown in FIG. 1B after the fuse has been programmed (e.g., a "blown" fuse), wherein the programming current has effectively melted or otherwise altered a state of the silicide layer 40 in a region 75, thereby forming a discontinuity 85 in the silicide layer, wherein agglomerations 80 of silicide are formed on either side of the discontinuity.

The fuse 15 of the prior art, however, does not allow for reliable localization of the discontinuity 85 and agglomerations 80 in the silicide layer 40. In other words, the region 75 of the fuse 15 that is melted can potentially occur at any location in the silicide layer 40 between the contacts 30 during programming. Since conventional processes involved in melting the silicide layer 40 typically generate a significant amount of potentially damaging heat, it is desirable to predict the region 75 in which the discontinuity 85 is potentially formed, and to further reduce an area (not shown) of the discontinuity in order to reduce an amount of energy required to program the fuse 15.

Figure 1D:
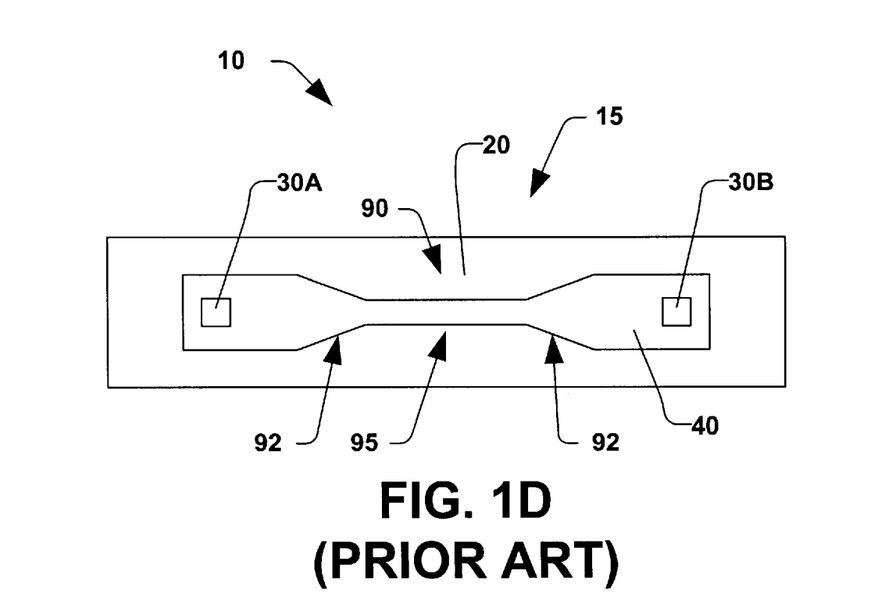
FIG. 1D illustrates a plan view of another conventional fuse.

Predicting the region 75 and reducing the area (not shown) of the potential discontinuity 85 may also reduce a potential for damage to adjacent components (not shown) when the fuse 15 is programmed. As illustrated in FIG. 1D, conventional attempts to localize the discontinuity (not shown) to a predefined region 90 of the silicide layer 40 have included narrowing regions 92 of the silicide layer 40 between generally equally-sized contacts 30 to form a narrowed region 95 (e.g., forming a "neck"). Other conventional attempts to minimize damage to a predefined region of the silicide layer have included extra process steps to form a weakness in the silicide layer, wherein the silicide melts under programming current.

Conventional fuse designs, however, have typically not eliminated the unwanted damage caused by blowing a fuse, or have added extra process steps, cost, or undesirable design qualities to the final product. Furthermore, commonly used fuses in the prior art have a relatively high parasitic resistance, making programming of the fuse more difficult, and raising concerns over stability and reliability of the fuse over time. Therefore, what is needed in the art is a reliable fuse that is fabricated such that programming of the fuse will result in reproducible degrading and melting of a silicide layer which uses less energy than conventional techniques, and wherein additional process steps are not required in the manufacture of the fuse.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention relates generally to a fuse formed over a semiconductor substrate. According to one exemplary aspect of the present invention, the fuse resides over a patterned polysilicon layer, wherein a first region and a second region are defined. A silicide layer resides over the polysilicon layer, and a first contact member and a second contact member electrically contact the silicide layer in the first region and second region, respectively, thereby defining a first interface having a first contact area between the first contact member and the silicide layer, and a second interface having a second contact area between the second contact member and the silicide layer.

According to one exemplary aspect of the present invention, the second contact area is smaller than the first contact area, wherein the second interface defines a fusible link. During programming of the fuse, a current density in the second region is greater than a current density in the first region when a programming current is applied to the first contact member, and the programming current is operable to melt or otherwise alter the fusible link, thereby electrically isolating the first contact member from the second contact member.

According to another exemplary aspect of the present invention, a width of patterned polysilicon layer is generally tapered, wherein a first width associated with the first region is larger than a second width associated with the second region. The tapered polysilicon layer furthermore increases the current density in the second region compared to the first region when the fuse is programmed with the programming current. According to yet another aspect of the present invention, the second contact member is generally frusto-conical in shape, the second contact member comprising a narrow end and a wide end, wherein a narrow end contacts the second contact area, thereby increasing the current density in the second region and at the second interface associated therewith.

According to still another exemplary aspect of the present invention, a method for forming a fuse over a silicon substrate is provided. The method begins with forming a polysilicon layer over a semiconductor substrate, and subsequently forming a silicide layer over the polysilicon layer. The silicide layer and polysilicon layer are patterned, whereby a fuse region comprising a first region and a second region is defined. A dielectric layer is formed over the substrate, and the dielectric layer is subsequently patterned, wherein a first contact hole and a second contact hole are defined in the first region and second region, respectively, wherein the first contact hole is larger than the second contact hole.

A plug metal is then deposited over the substrate, wherein the first contact hole and the second contact hole are filled by the plug metal, thereby defining a first contact member and a second contact member, respectively. According to one aspect of the invention, an interface between the second contact member and the silicide defines a fusible link. The plug metal is then planarized to at least the dielectric layer, thereby defining a fuse comprising the first contact, the second contact, the fusible link. According to another exemplary aspect of the invention, a wiring layer is subsequently patterned over the first contact member and second contact member, wherein the wiring layer interconnects the fuse to other components formed over the substrate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention is directed toward a fuse and a method for forming a fuse over a semiconductor substrate. Fuses are utilized in integrated circuits for a variety of applications, such as for redundancy in memory circuits and in customization schemes wherein a generic semiconductor chip can be utilized for several differing applications, dependent upon the utilization of a predetermined set of fuses integrated into the chip. However, as the semiconductor industry continues to require semiconductor chips having smaller devices for improved packing density, smaller voltages and currents are employed to accommodate the smaller transistor geometries. Therefore, it follows that a decrease in transistor size drives a reduction in supply voltage and currents which generally decreases an amount of energy available to program (i.e., "blow") fuses contained within the integrated circuit. Such a decrease in the amount of energy available to blow fuses has brought forth a need in the semiconductor industry for a semiconductor fuse which will operate in a generally predictable manner at the decreased programming energy.

Figure 2A:
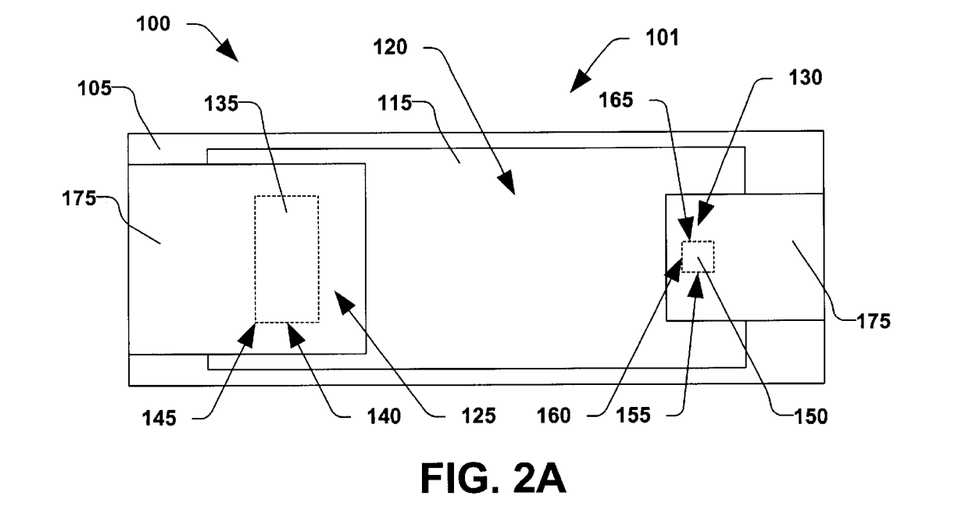
FIG. 2A illustrates a plan view of an exemplary fuse according to one exemplary aspect of the present invention.
Figure 2B:
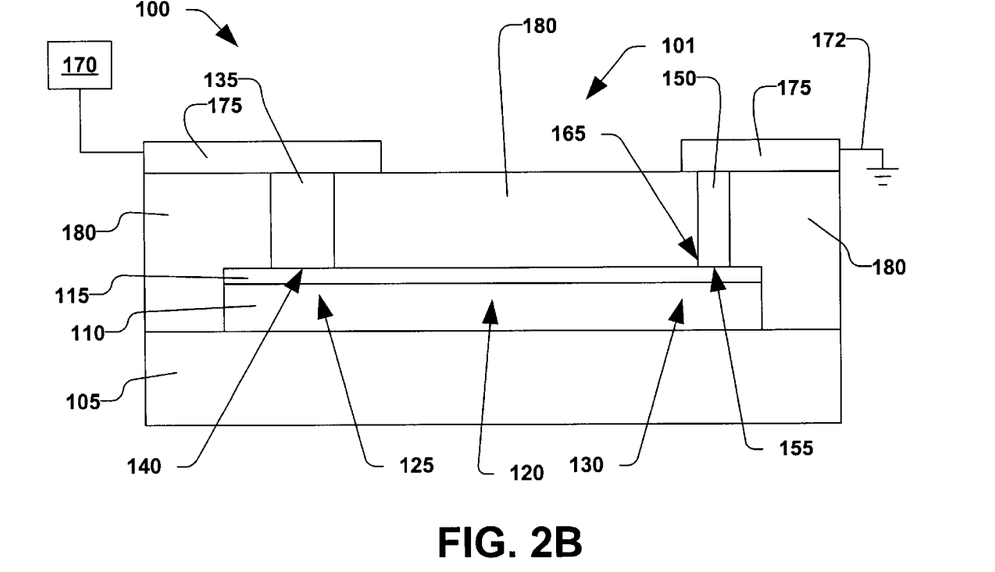
FIG. 2B illustrates a cross-section view of the exemplary fuse of FIG. 2A according to another exemplary aspect of the present invention.

FIGS. 2A and 2B illustrate a plan view and cross-sectional view, respectively, of a portion 100 of an integrated circuit (not shown) comprising an exemplary fuse 101 according one aspect to the present invention. The fuse 101 may be formed over a semiconductor substrate 105, wherein the semiconductor substrate comprises, for example, comprises fluorine-stripped, single-crystalline silicon. It will be understood by one of ordinary skill in the art that the fuse 101 may be formed over various layers (not shown) residing over the semiconductor substrate 105, and incorporation of all such layers are contemplated as falling within the scope of the invention. For example, the fuse 101 has been formed over a gate oxide (not shown) that electrically and thermally insulates the fuse from other components (not shown). The fuse 101 comprises a patterned polysilicon layer 110 and an electrically-conductive silicide layer 115 (e.g., a cobalt silicide, nickel silicide or other type silicide) which resides over the polysilicon layer 110. The silicide layer 115 and the polysilicon layer 110 generally define a fuse region 120, whereby a first region 125 and a second region 130 are furthermore defined therein.

The fuse 101 further comprises a first contact member 135 (illustrated in phantom in FIG. 2A and in cross-section in FIG. 2B) formed over the silicide layer 115. The first contact member 135 electrically contacts the silicide layer in the first region 125, thereby defining a first interface 140 between the first contact member and the silicide layer, wherein the first interface is characterized by a first contact area 145. The fuse 101 also comprises a second contact member 150 (illustrated in phantom in FIG. 2A and in cross-section in FIG. 2B) formed over the silicide layer 115. The second contact member 150 electrically contacts the suicide layer in the second region 130, thereby defining a second interface 155 between the first contact member and the silicide layer, wherein the second interface is characterized by a second contact area 160. The first contact member 135 and the second contact member 150, for example, comprise a plug metal such as tungsten. Furthermore, first contact member 135 and the second contact member 150, for example, may further comprise a barrier metal (not shown) such as titanium nitride between the silicide layer 115 and the plug metal. The first contact member 135 and the second contact member 150 may, for example, be electrically connected to a power source 170 and an electrical ground 172, respectively, via a wiring layer 175. The wiring layer 175 comprises, for example, a patterned layer of copper or aluminum, wherein the wiring layer connects the fuse 101 to other integrated circuit devices (not shown). The first contact member 135 and the second contact member 150, for example, are laterally separated one from another by a dielectric layer 180. The dielectric layer 180 comprises, for example, an inter-level dielectric (ILD) layer such as phosphosilicate glass (PSG), undoped phosphosilicate glass (USG), borophosphosilicate glass (BPSG), organosilicate glass (OSG) or the like.

In accordance with one aspect of the present invention, the lateral separation between the first and second contact members 135, 150 is made as small as possible which reduces an amount of parasitic resistance associated with the fuse and allows for less energy to be employed to "blow" the fuse.

Figure 2C:
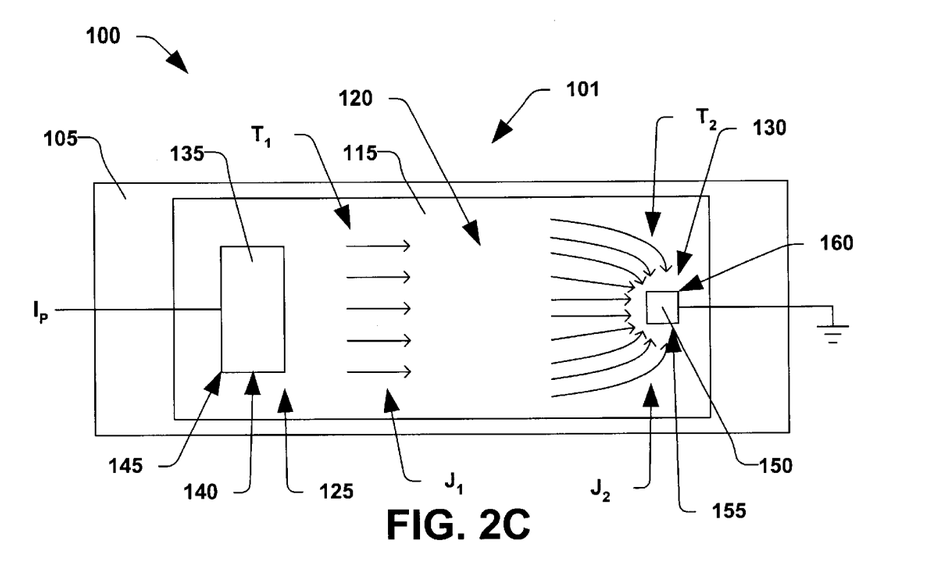
FIG. 2C illustrates a plan view of the exemplary fuse of FIG. 2A when the fuse is being programmed according to another exemplary aspect of the present invention.

According to one exemplary aspect of the invention, the second contact surface area 160 is smaller than the first contact surface area 145, thereby defining a fusible link 165 of the fuse 101 at the second interface 155. The second contact surface area 160, for example, is at least half the surface area of the first contact surface area 145. Various advantageous aspects of the fuse 101 of the present invention are achieved by providing the second contact member 150 with a second contact surface area 160 that is smaller than the first contact surface area 145 of the first contact member 135. For example, in a typical programming operation, as illustrated in FIG. 2C, a programming current $I_p$ is applied to the first contact member 135 via the power source 170, forming a first current density $J_1$ in the first region 125 and a second current density $J_2$ in the second region 130, therein. Since the second contact area 160 is smaller than the first contact surface area 145, it follows that the second current density $J_2$ will be larger than the first current density $J_1$ when the programming current $I_p$ is applied, as will be understood by one of ordinary skill in the art. Furthermore, since the second current density $J_2$ will be larger than the first current density $J_1$, it follows that a second thermal profile $T_2$ associated with the second region 130 will be larger than a first thermal profile $T_1$ associated with the first region 125 of the fuse 101.

The programming current $I_p$ is predetermined such that the second thermal profile $T_2$ in the second region 130 is operable to melt or otherwise alter the silicide layer 115 in the second region 130, thereby melting the fusible link 175 at the second interface 155, and electrically isolating the first contact member 135 from the second contact member 150. FIG. 2C illustrates a cross-sectional view of the fuse 101 in a programmed state, wherein the fusible link 175 has been melted or otherwise altered at the second interface 155, and wherein the first contact member 135 is electrically isolated from the second contact member 150 by a gap 185.

According to another exemplary aspect of the invention, the fuse 101 can be configured in a myriad of ways. Several exemplary fuses are illustrated in plan view in FIGS. 3A–3D. It should be noted that the fuses illustrated in the Figures are exemplary, however, and that they are not intended to limit the scope of the present invention.

Figure 3A:
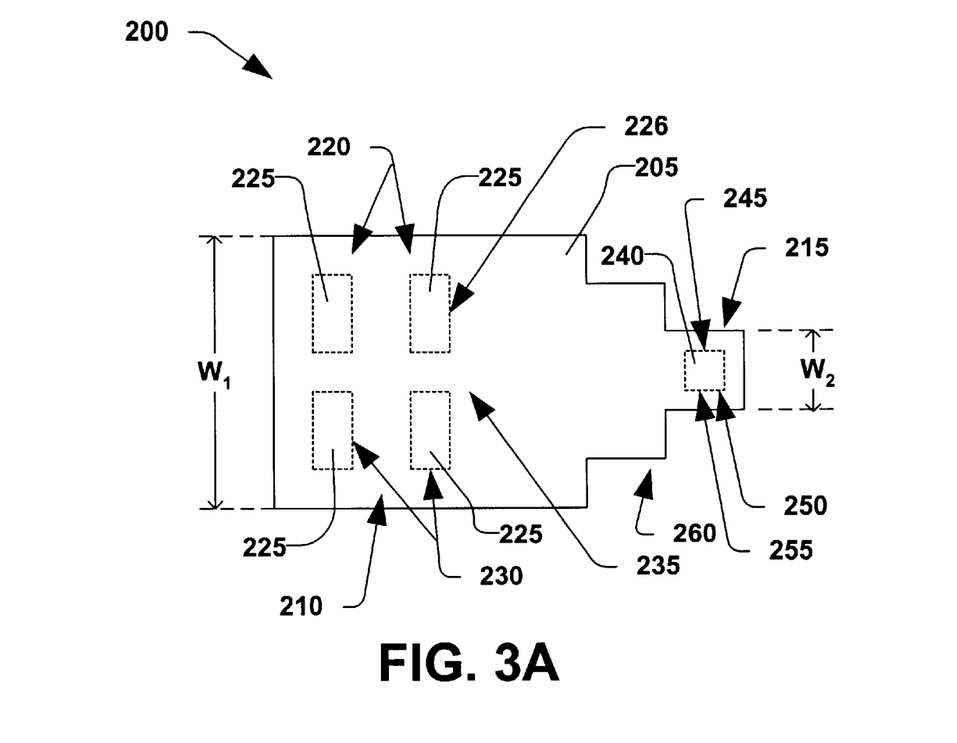
FIG. 3A illustrates a partial plan view of an exemplary fuse according to still another exemplary aspect of the present invention.

As illustrated in plan view in FIG. 3A, for example, a fuse 200 comprises a silicide layer 205 residing over a polysilicon layer (not shown), wherein the polysilicon layer and the silicide layer are generally tapered from a first region 210 to a second region 215. A first width W of the silicide layer 205 and the polysilicon layer (not shown) in the first region 210 is larger than a second width $W_2$ of the polysilicon layer and silicide layer in the second region 215. Exemplary FIG. 3A further illustrates the fuse 200 comprising a first contact member 220 which is divided into a plurality of separate contact members 225, wherein each of the plurality of separate members electrically contact the silicide layer 205 at a first interface 226, thereby defining a plurality of separate contact areas 230. Accordingly, a first contact area 235 associated with the first contact member 220 is generally equivalent to the sum of each of the plurality of separate contact areas 230.

A plurality of separate contact members 225 may be utilized, for example, in order to maximize the first contact area 235, as will be understood by one of ordinary skill in the art. The fuse 200 further comprises a second contact member 240 which electrically contacts the silicide layer 205, wherein the second contact member has a second contact area 245 associated with a second interface 250 between the silicide layer and the second contact member 240, and wherein the second contact area is smaller than the first contact area 235. Accordingly a fusible link 255 is defined at the second interface 250.

The fuse 200 utilizes a generally tapered width (e.g., tapering from the first width $W_1$ to the second width $W_2$) of the silicide layer 205 and the polysilicon layer (not shown), thereby providing various advantages to the operation of the fuse over the prior art. For example, in order to maximize an amount of heat in the second region 215 during programming (e.g., an amount of heat which will melt or otherwise alter the silicide layer 205 at the fusible link 255), the programming current $I_p$ is "funneled" toward the second contact member 240 by making the second width $W_2$ of the electrically conductive silicide layer 205 smaller than the first width $W_1$. Accordingly, providing a fuse 200 comprising a generally tapered silicide layer 205 and polysilicon layer (not shown) increases the second current density $J_2$ for a given amount of energy, as compared to the fuse 101 of FIG. 2A. Furthermore, the generally tapered polysilicon layer (not shown) and silicide layer 205 of FIG. 3A advantageously increases the second current density $J_2$ compared to a current density (not shown) of the prior art fuse 10 illustrated in FIG. 1A.

Figure 3B:
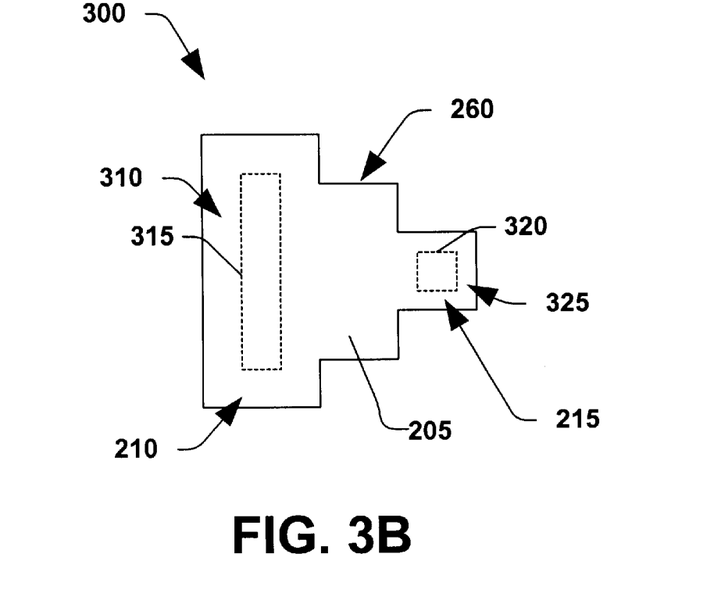
FIG. 3B illustrates a partial plan view of an exemplary fuse according to yet another exemplary aspect of the present invention.

FIG. 3B illustrates another exemplary fuse 300 in plan view, wherein the fuse comprises a first contact member 310 having a first contact area 315 which is generally rectangular in shape. The first contact area 315 is furthermore larger than a second contact area 320 associated with a second contact member 325. Providing a first contact member 310 having a generally rectangular shape generally allows the fuse 300 to occupy a significantly smaller area (not shown) on an integrated circuit (not shown), as will be understood by one of ordinary skill in the art. In addition, the fuse 300 may be more power efficient than the fuse 101 of FIG. 2A because current spreading in fuse 300 around the perimeter might be better and also exhibit a lower total resistance.

Figure 3C:
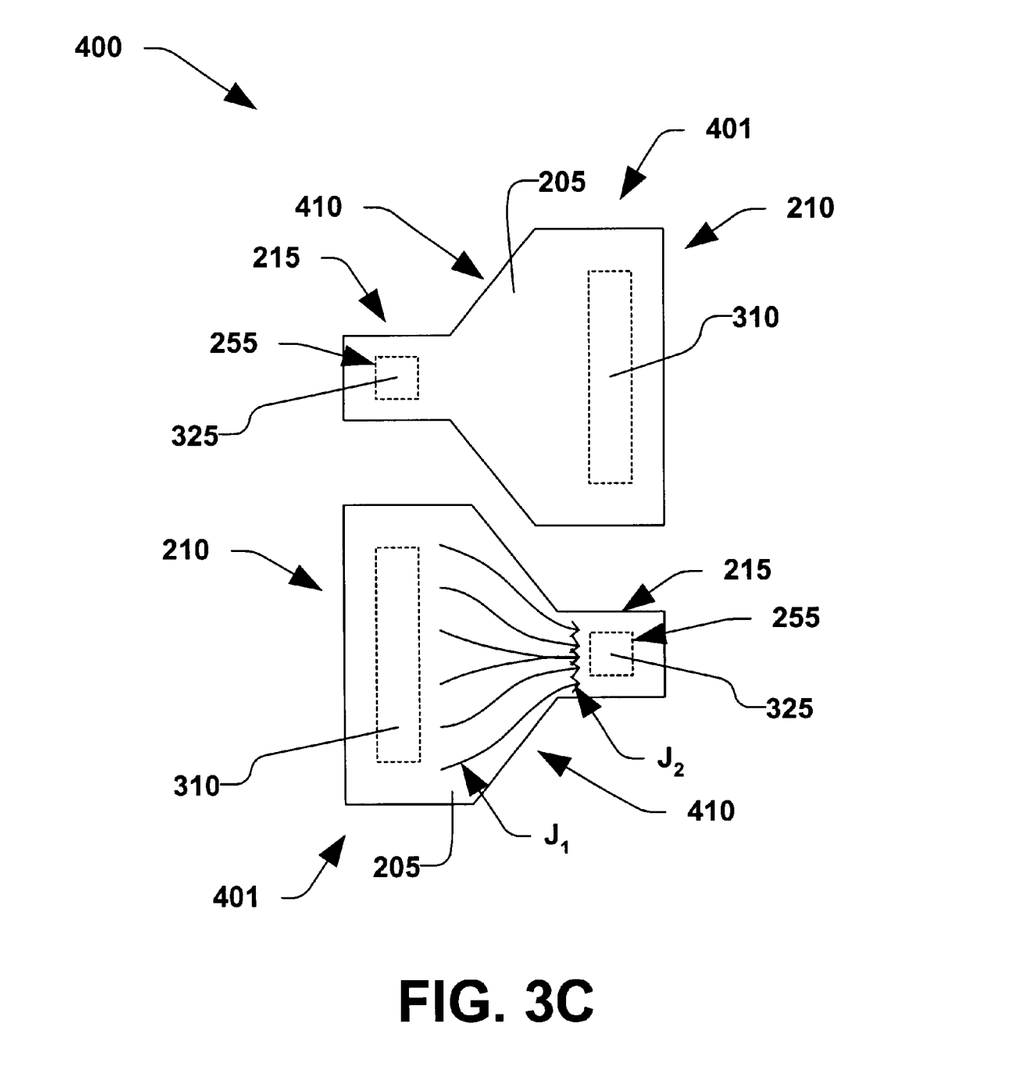
FIG. 3C illustrates a partial plan view of two exemplary fuses according to one exemplary aspect of the present invention.

According to another exemplary aspect of the invention, the fuses 200 and 300 of FIGS. 3A and 3B, respectively, comprise a silicide layer 205 and polysilicon layer (not shown) which are tapered from the first region 210 to the second region 215 in one or more discrete steps 260. Such a tapered polysilicon layer and silicide layer 205 can be formed utilizing standard semiconductor manufacturing techniques, as will be understood by one of ordinary skill in the art. According to yet another exemplary aspect of the present invention, FIG. 3C illustrates a pair 400 of fuses 401, wherein the polysilicon layers (not shown) and silicide layers 205 of each of the respective fuses are linearly tapered from the first region 210 to the second region 215. Such a linear taper 410 offers similar advantages to the steps 260 of FIGS. 3A and 3B, and may further be more densely situated on the integrated circuit (not shown) than the fuses 200 and 300. Furthermore, a linear taper 410 may provide advantageous funneling of the programming current $I_p$, wherein the current density $J_2$ is greater at the second contact member 325, thereby increasing the heat at the fusible link 255.

Figure 2D:
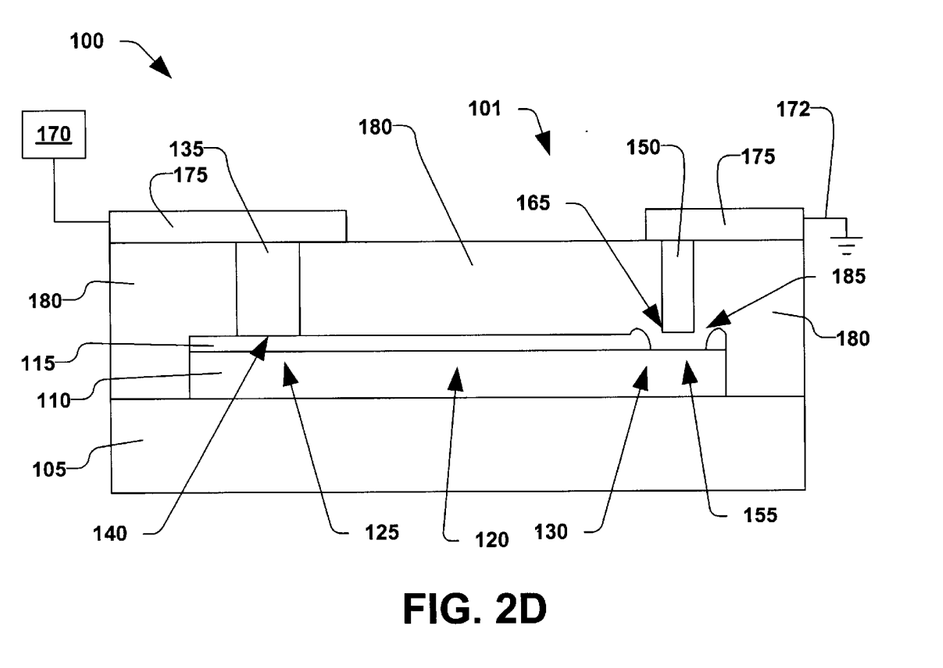
FIG. 2D illustrates a cross-section view of the exemplary fuse of FIG. 2A after the fuse is programmed according to another exemplary aspect of the present invention.

It should be noted that although current ($I_p$) has been illustrated as traveling from the large area contact member to the small area contact member in the above examples to comport with conventional nomenclature, the actual flow of electrons which comprise such current is in the opposite direction. Therefore in FIG. 2C, for example, upon application of a potential across the fuse 101, electrons flow through the second contact member 150 and through the second interface 155 into the silicide 115, and then travel toward the first contact member 135 in a manner opposite the arrows of FIG. 2C. If the rate of electrons passing through the second interface 155 exceeds a predetermined amount (e.g., corresponding to a programming current) the electrons cause the discontinuity or gap 185 at the interface 155, as illustrated in FIG. 2D.

Figure 3D:
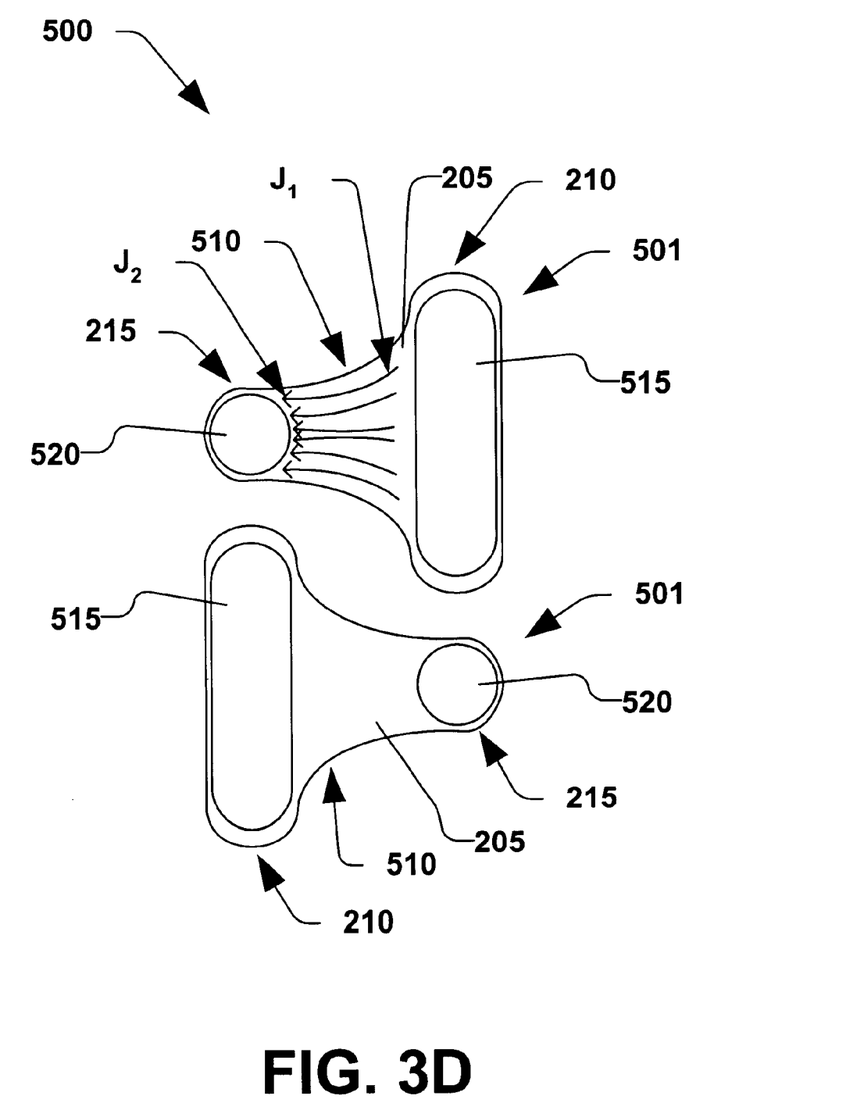
FIG. 3D illustrates a partial plan view of two exemplary fuses according to another exemplary aspect of the present invention.

According to still another exemplary aspect of the present invention, FIG. 3D illustrates an exemplary pair 500 of fuses 501, wherein the polysilicon layers (not shown) and silicide layers 205 of the fuses are curvilinearly tapered from the first region 210 to the second region 215. A curvilinear taper 510 further provides advantageous funneling of the programming current $I_p$, as will be understood by one of ordinary skill in the art. According to another exemplary aspect of the invention, the fuse 501 comprises a first contact member 515 and a second contact member 520 which are significantly rounded. Note that although some features previously have been illustrated as perfectly straight lines with square corners, that semiconductor processing typically results in rounded corners for such features, as is known.

Figure 3E:
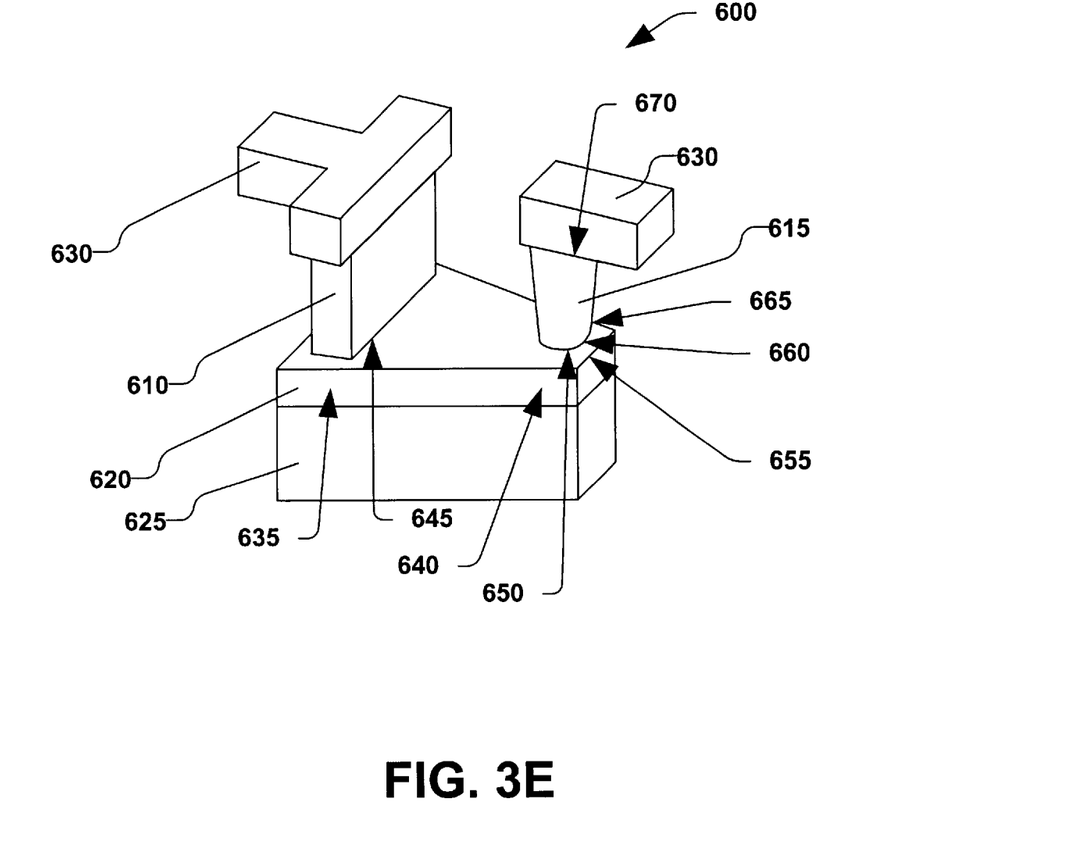
FIG. 3E illustrates a perspective view of an exemplary fuse according to yet another exemplary aspect of the present invention.

FIG. 3E illustrates an exemplary fuse 600 in perspective view according to still another aspect of the present invention. The fuse 600 comprises a first contact member 610 and a second contact member 615 which electrically contact a silicide layer 620, wherein the silicide layer resides over a polysilicon layer 625. A wiring layer 630 (e.g., a metal lead or wiring interconnect) electrically connects the first contact member 610 and the second contact member 615 of the fuse 600 to other components (not shown). The polysilicon layer 625 is generally tapered from a first region 635 to a second region 640 of the fuse 600, wherein a first contact area 645 associated with the first contact member 610 is larger than a second contact area 650 associated with the second contact member, thereby defining a fusible link 655 at a second interface 660 of the second contact member 615 and the suicide layer 620. As discussed previously, the distance between the first and second contact members 610, 615 is preferably minimized to reduce parasitic resistance of the fuse that, among other things, allows programming of the fuse using less power.

According to another exemplary aspect of the present invention, the second contact member 615 is frustoconical in shape, wherein the second contact member comprises a narrow end 665 and a wide end 670, and wherein the narrow end of the second contact member electrically contacts the silicide layer 620. The narrow end 665 further increases the second current density (not shown) in the second region 640 of the fuse 600, as will be understood by one of ordinary skill in the art.

The present invention is also directed toward a method for forming a fuse over a semiconductor substrate. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the apparatus and systems illustrated and described herein as well as in association with other systems not illustrated.

Figure 4:
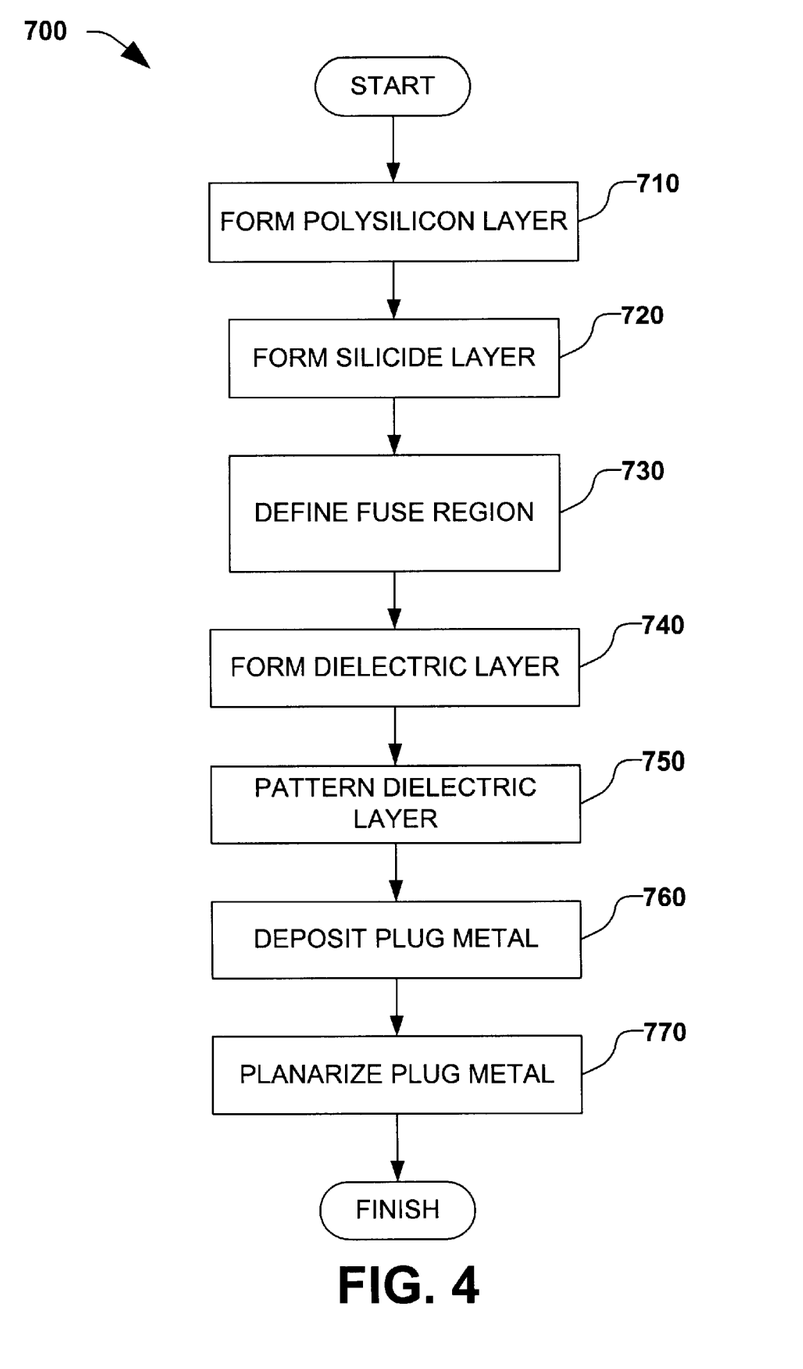
FIG. 4 illustrates a method for forming a fuse over semiconductor substrate according to one aspect of the present invention.
Figure 5A:
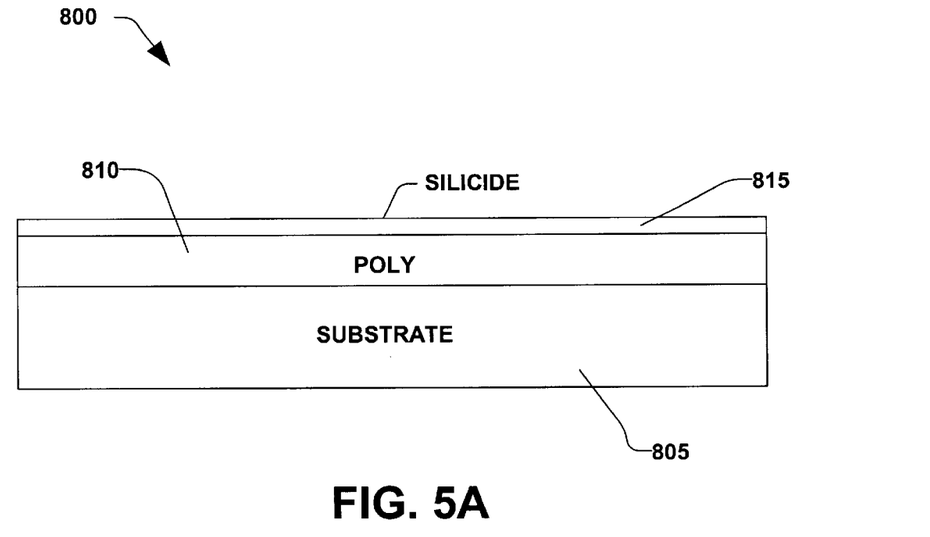
FIGS. 5A–5F illustrate steps in performing the method of FIG. 4 according to the present invention.

FIG. 4 illustrates an exemplary method 700 for forming a fuse, and begins in act 710 by forming a polysilicon layer over a semiconductor substrate. According to one exemplary aspect of the present invention, an oxide such as a gate oxide or field oxide is formed over the semiconductor substrate prior to forming the polysilicon layer in act 710, whereby the gate oxide electrically and thermally isolates the fuse from other devices on the semiconductor substrate. According to another exemplary aspect, the polysilicon layer is formed directly over the semiconductor substrate. After the polysilicon layer is formed in act 710, an electrically conductive silicide layer (e.g., cobalt silicide, nickel silicide or other type silicide) is formed over the polysilicon layer in act 720, for example, by deposition of a metal such as cobalt or nickel, followed by rapid thermal processing (RTP). Unreacted portions of metal are then removed. FIG. 5A illustrates, in cross-section, a portion 800 of the semiconductor substrate 805, wherein the polysilicon layer 810 has been formed over the semiconductor substrate in act 710, and the silicide layer 815 has been formed over the polysilicon layer.

Figure 5B:
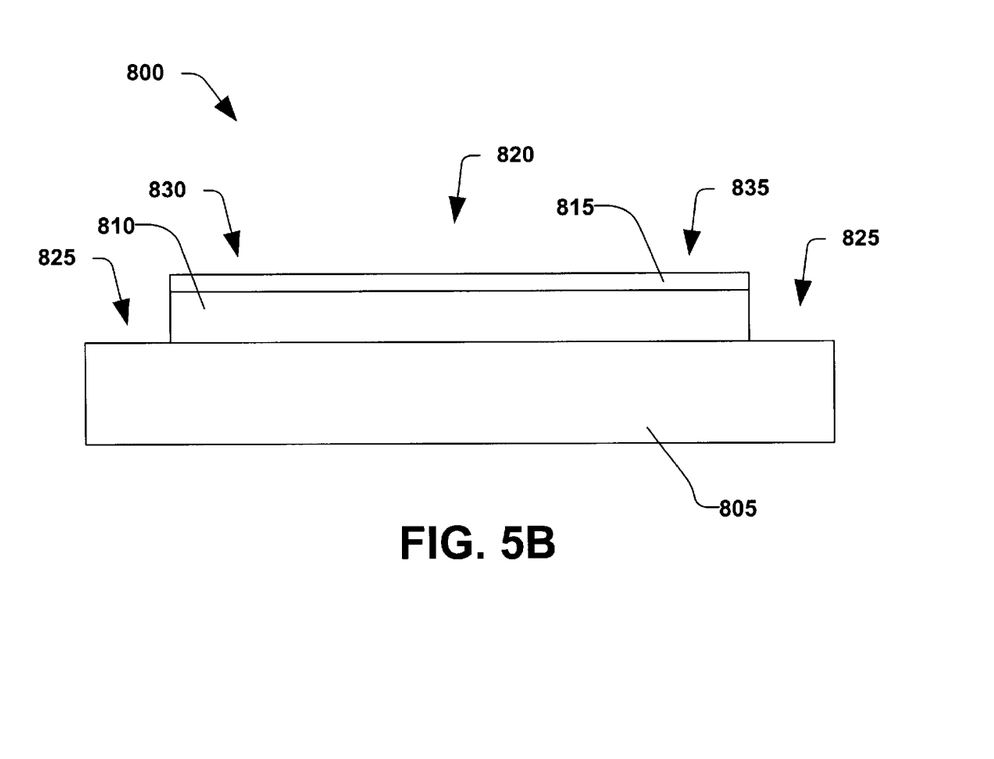

Referring again to FIG. 4, the silicide layer and the polysilicon layer are patterned in act 730, whereby a fuse region is defined. Alternatively, such definition may occur earlier by patterning the polysilicon prior to metal deposition and silicidation. In such case, the removal of unreacted metal after silicidation comprises the defining of the fuse region at 730. FIG. 5B illustrates the result of performing act 730, wherein the fuse region 820 has been defined. The fuse region 820, for example, is generally tapered, wherein a first region 830 of the fuse region is wider than a second region 835.

Figure 5C:
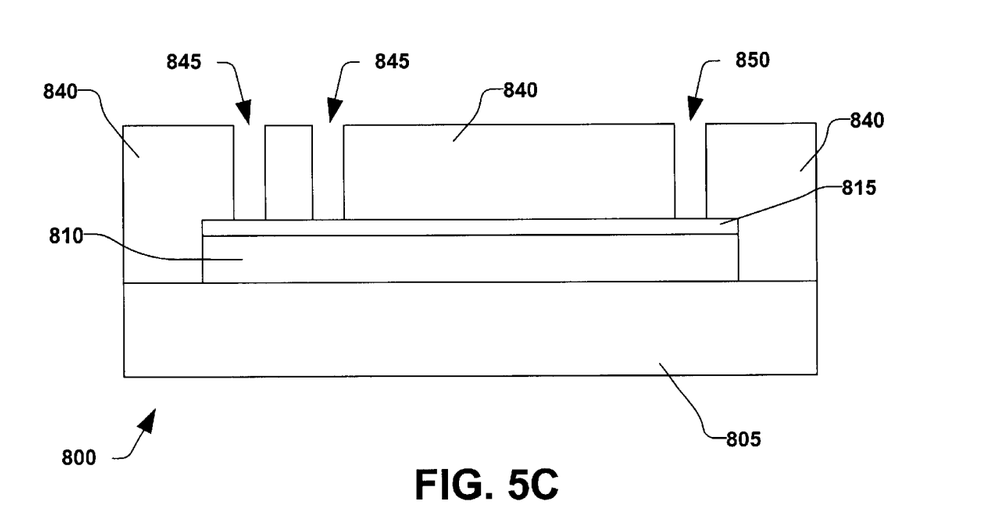

A dielectric layer is formed over the substrate in act 740 of FIG. 4, and the dielectric layer is subsequently patterned in act 750, wherein a first contact hole and a second contact hole are defined in the fuse region. FIG. 5C illustrates the results of performing acts 740 and 750, wherein the dielectric layer 840 comprises the first contact hole 845 and the second contact hole 850. According to one exemplary aspect of the invention, the first contact hole 845 is larger than the second contact hole 850. According to another exemplary aspect, more than one first contact holes 845 are formed in act 750. The dielectric layer 840 can comprise, for example, an inter-level dielectric (ILD) such as phosphosilicate glass (PSG), undoped phosphosilicate glass (USG), borophosphosilicate glass (BPSG), organosilicate glass (OSG), or the like.

Figure 5D:
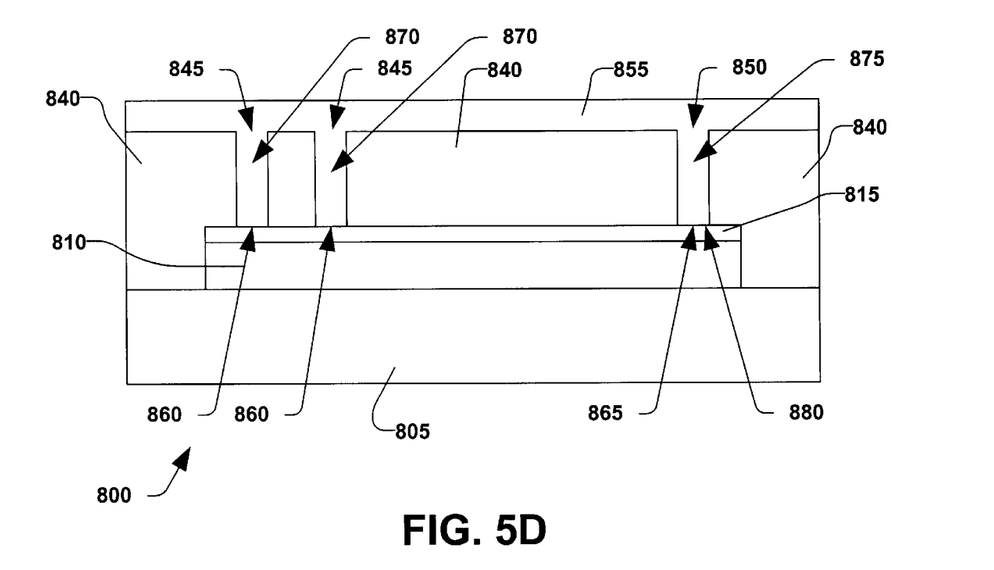

Following the formation of the first contact hole and the second contact hole in act 750 of FIG. 4, a plug metal is deposited over the substrate in act 760, wherein the first contact hole and the second contact hole are filled by the plug metal, thereby defining a first contact and a second contact, respectively. FIG. 5D illustrates the result of performing act 760, wherein the first contact hole 845 and the second contact hole 850 have been filled with a plug metal 855. The plug metal 855 in the first contact hole 845 and the second contact hole 850 electrically contact the silicide layer 815 at a first interface 860 and a second interface 865, respectively, thereby defining a respective first contact member 870 and a second contact member 875, wherein the second interface generally defines a fusible link 880.

Figure 5E:
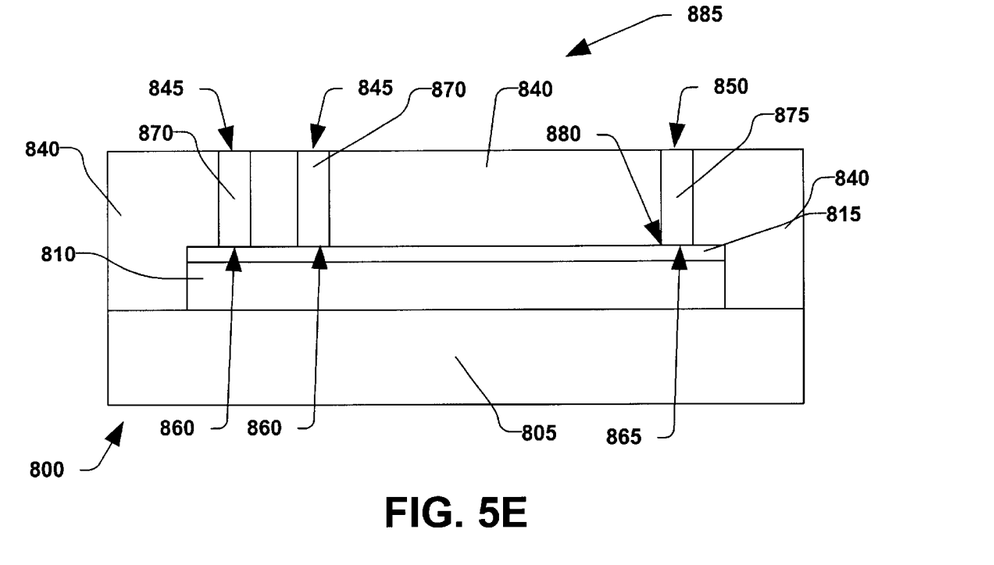

Referring again to FIG. 4, the plug metal is planarized to at least the dielectric layer in act 770, thereby laterally electrically isolating the first contact member and the second contact member, and furthermore defining a fuse comprising a first contact member, a second contact member, and a fusible link. The planarization, for example, comprises chemical mechanical polishing (CMP). FIG. 5E illustrates the result of performing the planarization of act 770, wherein the first contact member 870 and second contact member 875 are laterally electrically isolated by the dielectric layer 840. The fusible link 880 is illustrated generally at the second interface 885 between the second contact member 875 and the silicide layer 815. The resulting fuse 885 is furthermore operable to be programmed by running a predetermined programming current $I_p$ from the first contact member 870, through the fusible link 880, to the second contact member 875, wherein the predetermined programming current $I_p$ is operable to generate enough heat to melt the fusible link.

Figure 5F:
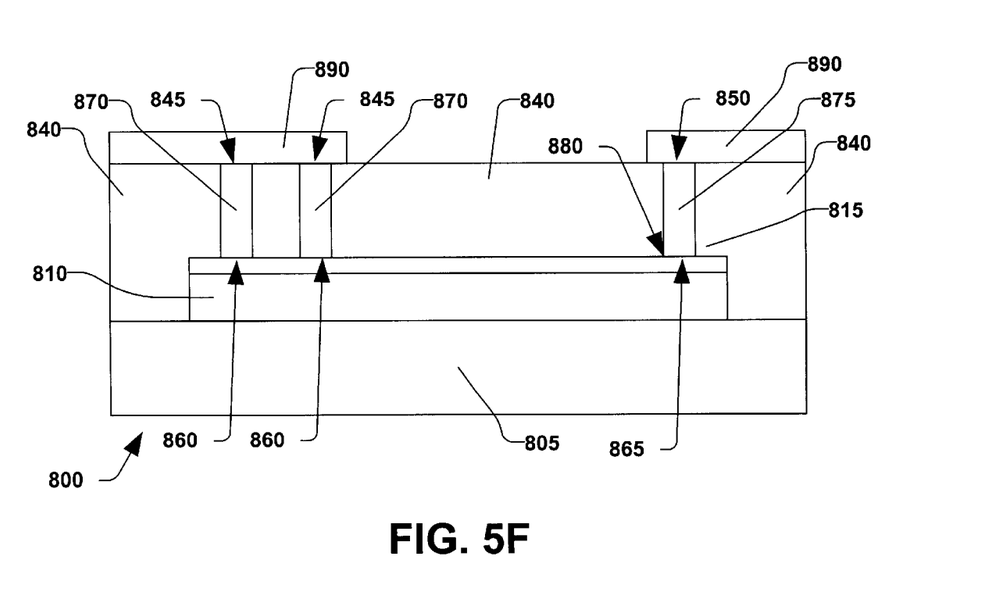

According to another exemplary aspect of the present invention, a barrier metal (not shown) is deposited prior to depositing the plug metal 855 in act 760 of FIG. 4. The barrier metal (not shown), such as titanium nitride, protects the plug metal 855 from reacting with the suicide 815. Furthermore, the barrier metal is also planarized in the planarization of act 770, wherein the planarization generally removes the barrier metal (not shown) residing above the dielectric layer. According to yet another exemplary aspect of the invention, a wiring layer is patterned over the semiconductor substrate after the planarization of act 770, wherein the wiring layer interconnects the fuse to other components. FIG. 5F illustrates the resulting fuse 885, wherein the wiring layer 890 interconnects the fuse to other integrated circuit components (not shown).

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A fuse formed over a semiconductor substrate, the fuse comprising:
   a patterned polysilicon layer, wherein a fuse region is defined, the fuse region having a first region and a second region further defined therein;
   an electrically-conductive suicide layer residing over the polysilicon layer;
   a first contact member, wherein the first contact member electrically contacts the silicide layer in the first region, thereby defining a first interface having a first contact area between the first contact member and the silicide layer; and a second contact member, wherein the second contact member electrically contacts the silicide layer in the second region, thereby defining a second interface having a second contact area between the second contact member and the silicide layer, wherein the second contact area is smaller than the first contact area, and wherein the second interface defines a fusible link, wherein a current density in the second region is greater than a current density in the first region when a programming current is applied to the first contact member, wherein the programming current is operable to melt the fusible link, thereby electrically isolating the first contact member from the second contact member.

2. The fuse of claim 1, wherein a width of the polysilicon layer in the fuse region is generally tapered, and wherein the first region is wider than the second region.

3. The fuse of claim 2, wherein the width of the polysilicon layer in the fuse region is tapered from the first region to the second region in one or more discrete steps.

4. The fuse of claim 2, wherein the width of the polysilicon layer in the fuse region is linearly tapered from the first region to the second region.

5. The fuse of claim 2, wherein the width of the polysilicon layer in the fuse region is curvilinearly tapered from the first region to the second region.

6. The fuse of claim 1, wherein the first contact member comprises a plurality of separate contact members.

7. The fuse of claim 1, further comprising a wiring layer patterned over the first contact member and the second contact member, wherein electrical connections to the first contact member and the second contact member are defined, and wherein the wiring layer electrically connects the first contact member and the second contact member to other devices on the substrate.

8. The fuse of claim 1, wherein the polysilicon layer resides over fluorine-stripped, single-crystalline silicon.

9. The fuse of claim 1, wherein the polysilicon layer resides over a gate oxide.

10. The fuse of claim 1, wherein the first contact member and the second contact member are laterally separated by a dielectric material.

11. The fuse of claim 1, wherein the second contact member is generally frustoconical in shape, the second contact member comprising a narrow end and a wide end, wherein a narrow end contacts the second contact area, thereby increasing the current density in the second region.

12. The fuse of claim 1, wherein the first contact member is generally rectangular in shape, and wherein the first contact area is also generally rectangular in shape.

13. The fuse of claim 1, wherein the first contact area is at least twice as large as the second contact area, thereby providing a greater amount of thermal energy transfer from the first contact area to the second contact area when the programming current is applied.

14. The fuse of claim 1, wherein the first contact member and the second contact member are comprised of a plug metal.

15. The fuse of claim 14, wherein the plug metal comprises tungsten.

16. The fuse of claim 14, wherein the first contact member and the second contact member further comprise a barrier metal between the silicide layer and the plug metal.

17. The fuse of claim 16, wherein the barrier metal comprises titanium nitride.

18. A method of forming a fuse over a semiconductor substrate, the method comprising the acts of:

forming a polysilicon layer over the substrate;

forming a conductive silicide layer over the polysilicon layer;

patterning a silicide layer and the polysilicon layer, thereby defining a fuse region;

forming a dielectric layer over the substrate;

patterning the dielectric layer, wherein a first contact hole and a second contact hole are defined in the fuse region, wherein the first contact hole is larger than the second contact hole;

depositing a plug metal over the substrate, wherein the first contact hole and the second contact hole are filled by the plug metal, thereby defining a first contact member and a second contact member, respectively, wherein an interface between the second contact member and the silicide defines a fusible link; and planarizing the plug metal to at least the dielectric layer, thereby defining a fuse comprising the first contact, the second contact, the fusible link.

19. The method of claim 18, further comprising the act of:

deposing a first metal layer over the substrate after the planarization; and patterning the first metal layer to form electrical connections to other devices on the substrate.

20. The method of claim 18, further comprising the act of forming an oxide over the substrate prior to forming the polysilicon layer.

21. The method of claim 20, wherein the oxide comprises a field oxide.

22. The method of claim 18, wherein patterning the silicide layer and the polysilicon layer comprises forming a generally tapered fuse region having a first region and a second region, wherein the first region is wider than the second region.

23. The method of claim 18, further comprising depositing a barrier metal layer prior to depositing the plug metal, and wherein planarizing the plug metal further comprises planarizing the barrier metal.

24. The method of claim 18, further comprising patterning a wiring layer over the first contact member and the second contact member.

* * * * *